United States Patent [19]
Andoh

[11] Patent Number: 5,113,525
[45] Date of Patent: May 12, 1992

[54] LINEAR-MODULATION TYPE RADIO TRANSMITTER

[75] Inventor: Akira Andoh, Hyogo, Japan

[73] Assignee: Mitsubishi Denki Kabushiki Kaisha, Tokyo, Japan

[21] Appl. No.: 600,379

[22] Filed: Oct. 19, 1990

[30] Foreign Application Priority Data

Nov. 6, 1989 [JP] Japan .................................. 1-28818
Nov. 10, 1989 [JP] Japan .................................. 1-29383

[51] Int. Cl.$^5$ ............................................ H04B 1/04
[52] U.S. Cl. .................................... 455/127; 455/115
[58] Field of Search ................ 455/67, 127, 115, 117, 455/343, 226, 89

[56] References Cited

U.S. PATENT DOCUMENTS 4,007,428  2/1977  Brown et al. .
4,502,152  2/1985  Sinclair ............................. 455/127
4,706,262  11/1987  Ohta .
4,819,272  4/1989  Shimo et al. ....................... 455/127

FOREIGN PATENT DOCUMENTS 65339  11/1982  European Pat. Off. .
515348  12/1939  United Kingdom .
536538  5/1941  United Kingdom .
625915  7/1949  United Kingdom .
2035731  6/1980  United Kingdom .
2098819  11/1982  United Kingdom .

Primary Examiner—Curtis Kuntz
Attorney, Agent, or Firm—Rothwell, Figg, Ernst & Kurz

[57] ABSTRACT

The present invention relates to a radio transmitter which transmits from an antenna a carrier wave linearly modulated based on a signal to be transmitted. Since a monitor wave with the predetermined level applied to a transmission power amplifier is amplified and the level of the amplified monitor wave is thereafter detected, followed by adjustment of the gain of the transmission power amplifier based on its level detected, or since the comparison between the level of an envelope component of a signal prior to modulation and that of an amplified signal is made and the gain of the transmission power amplifier is adjusted based on the result of its comparison, mean transmission power is maintained at a predetermined value.

12 Claims, 10 Drawing Sheets

FIG.7
(a) 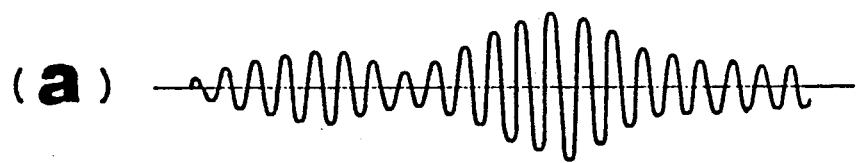
(b) 
(c) 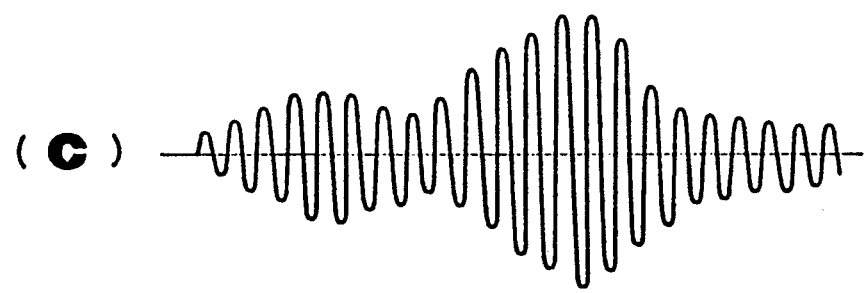
(d) 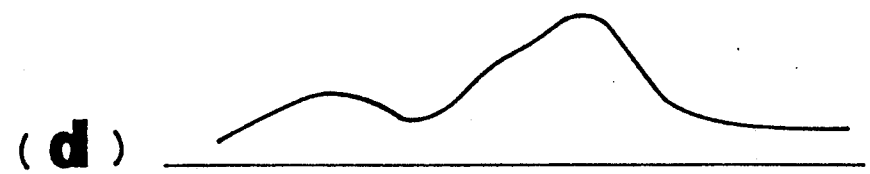

LINEAR-MODULATION TYPE RADIO TRANSMITTER

BACKGROUND OF THE INVENTION

1. Field of the Invention

The present invention relates to a linear-modulation type radio transmitter which is capable of adaptively controlling mean transmission power.

2. Description of the Prior Art

FIG. 1 is a block diagram showing a conventional radio transmitter. In the same drawing, there are shown an FM modulator 1 for performing frequency modulation (hereinafter called "FM"), a variable attenuator 2 for applying predetermined attenuation to an FM wave from the FM modulator 1, a power amplifier 3 for performing power amplification of the FM wave attenuated by the variable attenuator 2, a transmission power amplifier 4 consisting of the variable attenuator 2 and the power amplifier 3, a directional coupler 5 connected to the transmission power amplifier 4 and for detecting a progressive wave from outputs delivered from the transmission power amplifier 4, and a transmit antenna 6 connected to the directional coupler 5 and for radiating in space an FM wave subjected to power amplification of the transmission power amplifier 4.

In the same drawing, there are further shown a level detector 7 for detecting the level of the progressive wave detected by the directional coupler 5 and for producing a detection voltage corresponding to the voltage level of the progressive wave, a differential amplifier 8 for amplifying the difference in voltage, i.e., an error voltage between the detection voltage from the level detector 7 and a reference voltage, a reference voltage selecting circuit 9 for selectively supplying reference voltages of $V_1$-$V_n$, which have been set in advance in association with a plurality of power outputs to be transmitted from a predetermined antenna, to the differential amplifier 8, a loop filter 10 serving to determine the frequency-response characteristics of the loop, and an error amplifier 11 consisting of the differential amplifier 8 and the reference voltage selecting circuit 9.

A description will now be made of the operation of the radio transmitter referred to above. After an FM wave generated from the FM modulator 1 has been subjected to predetermined attenuation by the variable attenuator 2, maximum power is delivered to the same by the power amplifier 3. The FM wave, which has been subjected to power amplification, is fed via the directional coupler 5 to the transmit antenna 6 from which it is radiated in space.

On the other hand, the directional coupler 5 detects a progressive wave from the FM wave subjected to power amplification and then applies the same to the level detector 7. Then, the level detector 7 converts the voltage level of the progressive wave applied thereto into a detection voltage corresponding to the voltage level thereof, and thereafter applies the same to one of the input terminals of the differential amplifier 8. A reference voltage, which has been set at the time of input of the detection voltage and corresponds to power to be output from the transmit antenna, i.e., a reference voltage $V_1$, is selected by the reference voltage selecting circuit 9 in the illustrative example and applied to the other input terminal of differential amplifier 8. Then, the differential amplifier 8 serves to amplify the difference in voltage, i.e., an error voltage between the detection voltage from the level detector 7 and the reference voltage $V_1$ from the reference voltage selecting circuit 9, and then feeds back the amplified voltage to the variable attenuator 2 in the transmission power amplifier 4 through the loop filter 10.

The variable attenuator 2 controls the level of attenuation based on signals from the loop filter 10. As a result, the sum of the gain corresponding to the level of attenuation by the variable attenuator 2 and the gain of the power amplifier 3 is adjusted such that the error voltage between the detection voltage from the level detector 7 and the reference voltage $V_1$ from the reference voltage selecting circuit 9 becomes smaller. Thus, the transmission power of the FM wave, which is radiated in space from the transmit antenna 6, is automatically controlled to a predetermined value which has been set in advance, without being affected by variations in the supply voltage, changes in temperature or the like.

FIG. 2 is a circuit diagram showing one embodiment of a transmission power amplifier 4 which is constructed of field effect transistors or the like. It is found from its circuit diagram that a modulated carrier wave applied to the input terminal is amplified with an amplification factor depending on a power amplification control signal applied to a control input terminal and the amplified carrier wave is output as an amplified signal from the output terminal.

As the conventional radio transmitter has been constructed as described above, the transmission power can be controlled automatically where the envelope of the modulated carrier wave does not rely on the modulating signal and is constant, as in the case where frequency modulation is employed. Where the linear modulation is of such a type that the envelope of the modulated carrier wave varies according to the modulating signal employed, the envelope component of the modulated carrier wave is suppressed by the feedback control, thereby causing a problem in that information borne by the modulated carrier wave itself is attenuated or destroyed It is desired to prevent variations in the envelope component by increasing the time constant of the feedback loop. However, by increasing the time constant, the response time for power ramping increases; thus this method cannot be applied to intermittent burst transmission.

SUMMARY OF THE INVENTION

With the foregoing problems in mind, it is therefore the object of the present invention to provide a linear-modulation type radio transmitter of a type wherein a value representative of mean transmission power can automatically be kept constant without suppressing the envelope component of a linearly-modulated carrier wave, and the mean transmission power can automatically be controlled so as to be constant as well as provide a quick rise characteristic when burst transmission is performed.

According to one aspect of the present invention, there is provided a linear-modulation type radio transmitter, comprising a monitor wave generator for applying a monitor wave together with a linear modulation wave (linearly-modulated carrier wave) to a transmission power amplifier and for generating, at a predetermined amplitude, the monitor wave having frequencies which are not included within a transmission band of the carrier wave, a level detector for detecting the level of components of the monitor wave out of output signal waves from the transmission power amplifier and for converting the same into a detection voltage corresponding the level of the components of the monitor wave and an error amplifier for adjusting the gain of the transmission power amplifier based on the detection voltage.

Accordingly, the present invention can achieve a radio transmitter with the above-described construction that can automatically control transmission power to a given set value without suppressing the envelope component of the linear modulation wave by extracting the monitor wave having a predetermined amplitude from applied waves, detecting the level of the monitor wave and then adjusting the gain of the transmission power amplifier based on the level of the detected monitor wave, thus ensuring a quick rise time even in the case of burst transmission.

According to a second aspect of the present invention, there can also be provided a linear-modulation type radio transmitter, comprising a transmission power amplifier for receiving a linearly-modulated carrier wave and capable of adjusting its transmission gain, a level detector for detecting the envelope component of the amplified signal output from the transmission power amplifier, a scaling circuit for performing level conversion of either the envelope component of a modulation signal or an output signal from the level detector with a coefficient depending on mean transmission power which has been determined in advance, and a comparator for comparing the level of an output signal from the level detector or the level of the envelope component of the modulation signal with that of an output signal from the scaling circuit and for supplying to the transmission power amplifier a control signal allowing the level of the amplified signal to be a value corresponding to the predetermined mean transmission power based on the result of its comparison.

The scaling circuit also performs level conversion of the level of the envelope component of the modulation signal or the envelope component of the amplified signal with the coefficient depending on the mean transmission power and then produces the scaled level. In addition, the comparator performs the comparison between the level of the envelope component of the modulation signal and the scaled level or between the level of the amplified signal and the scaled level, and then outputs a control signal representative of the quantity of attenuation to be adjusted by the transmission power amplifier thereto in order to cause the level of the amplified signal to be a value corresponding to the mean transmission power.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

FIG. 7(a)-(d) are graphic representations of the shape of a wave which appears at each unit of the radio transmitter shown in FIG. 6;

DETAILED DESCRIPTION OF THE PREFERRED EMBODIMENTS

Figure 1:
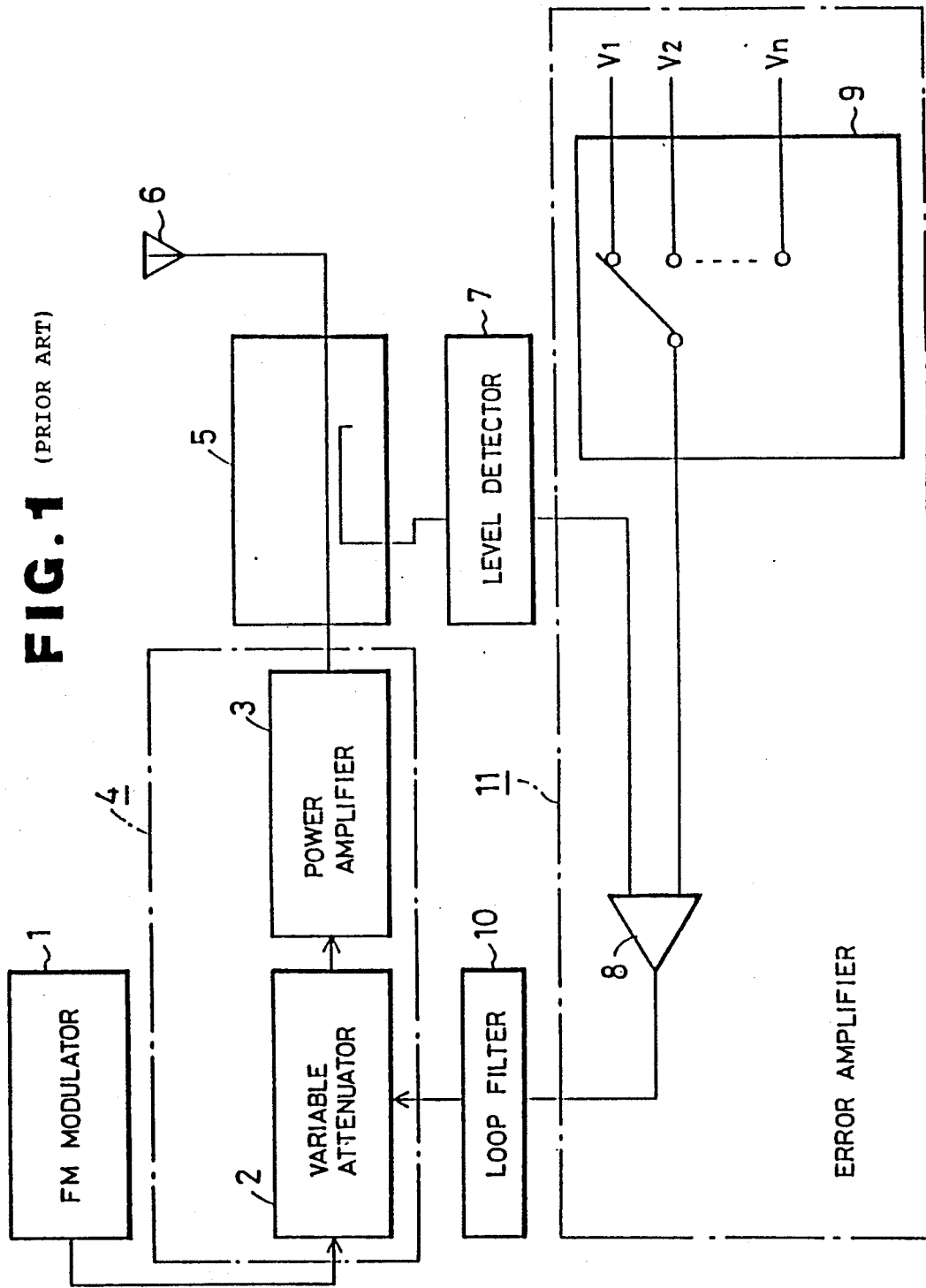
FIG. 1 is a block diagram showing a conventional radio transmitter.
Figure 2:
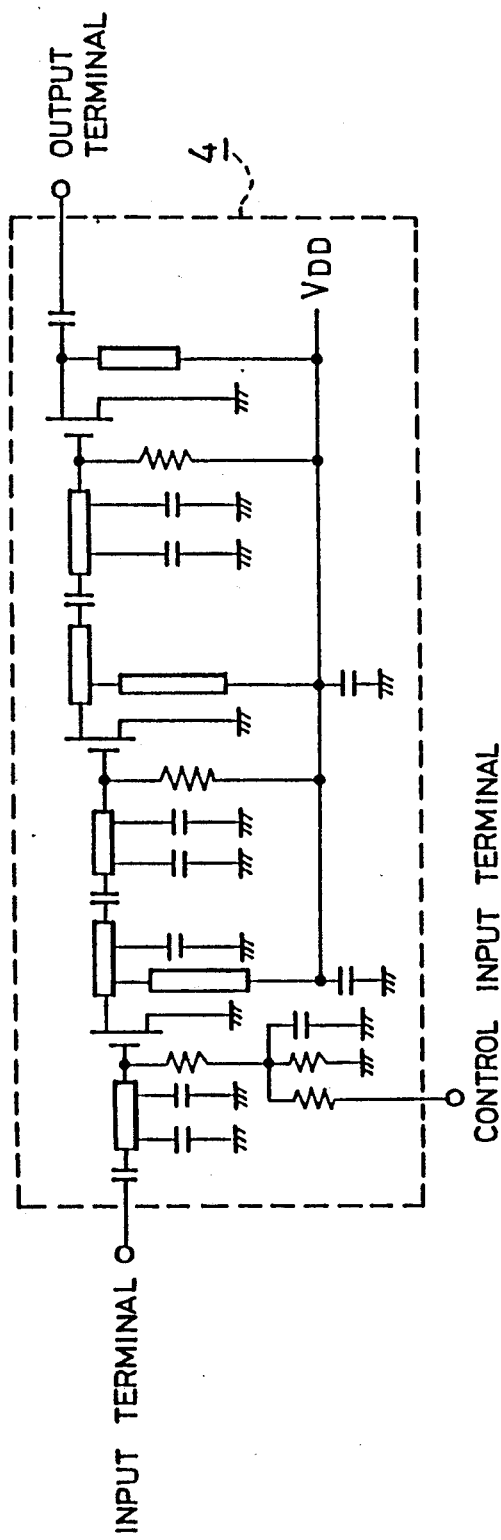
FIG. 2 is a circuit diagram depicting an illustrative example of the construction of a transmission power amplifier.
Figure 3:
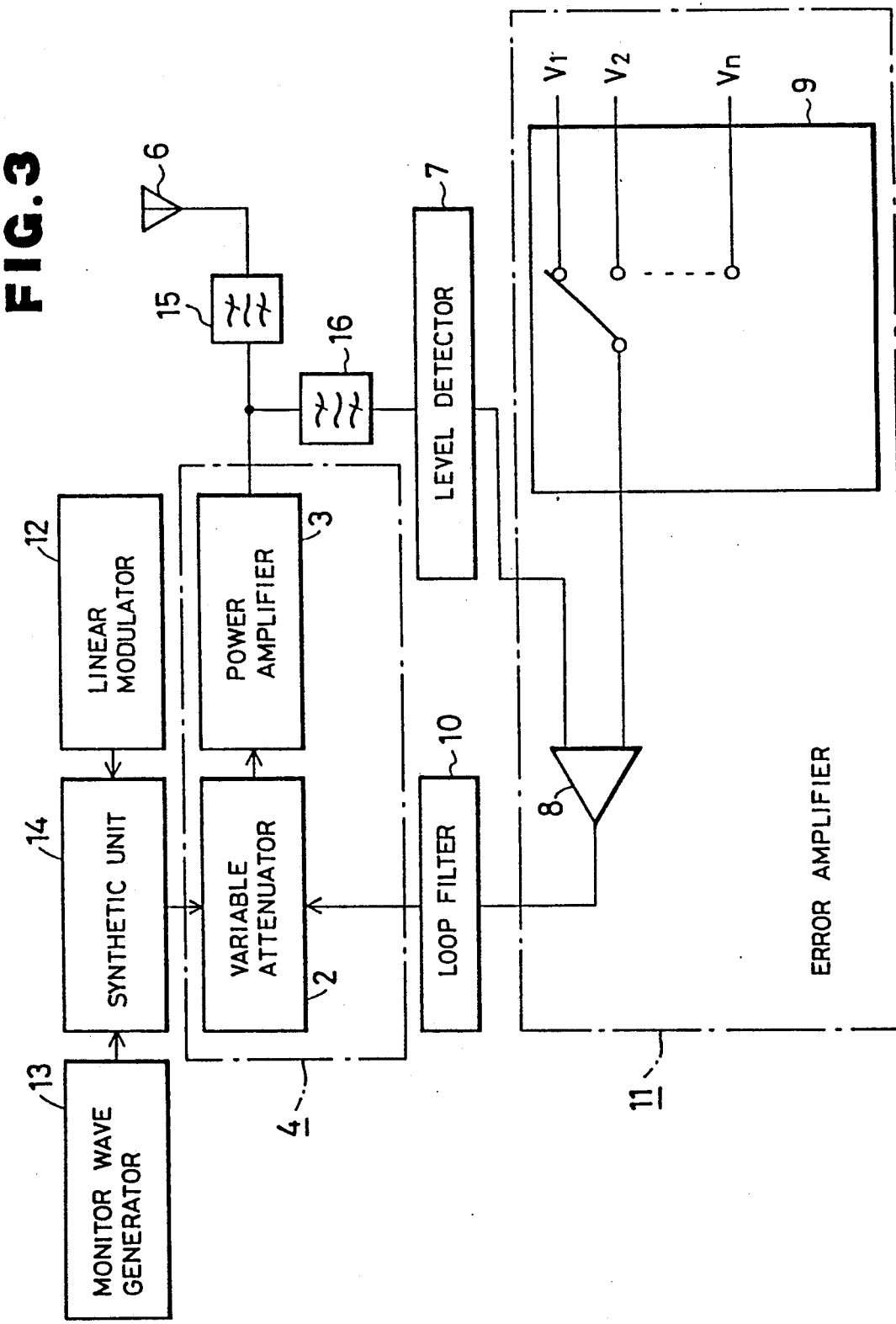
FIG. 3 is a block diagram showing a radio transmitter according to a first embodiment of the present invention.

One embodiment of the present invention will hereinafter be described with reference to the accompanying drawings. In FIG. 3, there are shown a variable attenuator 2, a power amplifier 3, a linear-type transmission power amplifier 4, a transmit antenna 6, a differential amplifier 8, a reference voltage selecting circuit 9, a loop filter 10 and an error amplifier 11. These elements of a structure such as that in the embodiment shown in FIG. 3 or the elements of a structure similar to those in the embodiment depicted in FIG. 3 are identified by the same reference numerals shown in FIG. 1 and their descriptions will therefore be omitted.

Designated at numeral 12 is a linear modulator for performing linear modulation such as amplitude modulation. Numeral 13 indicates a monitor wave generator for generating unmodulated monitor waves having frequencies not included in the transmission band of the linear modulation waves and having no variation in their amplitude. Designated at numeral 14 is a synthetic unit for performing combination of a linear modulation wave from the linear modulator 12 and a monitor wave from the monitor wave generator 13 and for delivering the combined wave to the variable attenuator 2 in the transmission power amplifier 4.

Designated at numeral 15 is a bandpass filter for separating the components of a linear modulation wave from the output signals delivered from the power amplifier 3 so as to deliver the same to the transmit antenna 6. Numeral 16 indicates another bandpass filter for separating the component of a monitor wave from output signals fed from the transmission power amplifier 4. Further, designated at numeral 7 is a level detector for detecting the level of the monitor wave separated by the bandpass filter 16 and for converting the same into a detection voltage corresponding to the level of the monitor wave.

A description will now be made on the operation of the present embodiment. A linear modulation wave produced by the linear modulator 12 and a monitor wave generated by the monitor wave generator 13 are applied to the synthetic unit 14 where they are combined together. The combined wave is then delivered to the transmission power amplifier 4. The combined wave applied thereto is subjected to a predetermined attenuation by the variable attenuator 2 and thereafter subjected to power amplification by the power amplifier 3 to be delivered to the following step. Thus, the gain of the transmission power amplifier 4 results from the sum of the quantity of attenuation by the variable attenuator 2 and the gain of the power amplifier 3. The combined wave, which has been subjected to power amplification by the transmission power amplifier 4, is input to the bandpass filters 15 and 16.

Figure 4:
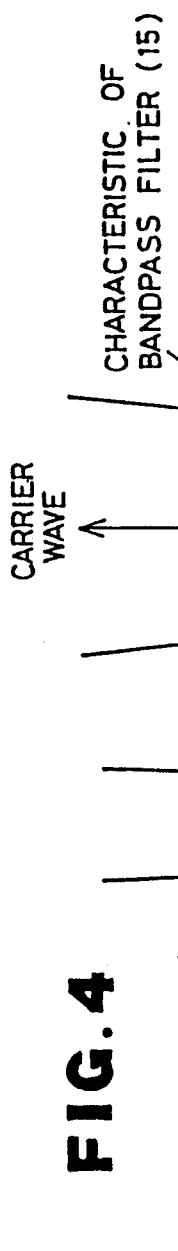
FIG. 4 is a characteristic diagram for describing the characteristic of a filter.

Here, the relation between the carrier wave, the transmission band of the linear modulation wave and the frequency of the monitor wave, and the frequency characteristic of each of the bandpass filters 15, 16 is shown in FIG. 4. As illustrated in FIG. 4, the bandpass filter 15 has the transmission band of the linear modulation wave as its passband. Thus, the bandpass filter 15 serves to separate or extract only the component of the linear modulation wave from the combined wave and deliver the same to the transmit antenna 6 from which it is radiated into space. On the other hand, the bandpass filter 16 includes, as a passband, the monitor wave set to a frequency lower than any frequency within the transmission band of the linear modulation wave, and separates only the component of the monitor wave from the combined wave to be delivered to the level detector 7.

Then, the level detector 7 serves to convert the level of the applied monitor wave into a detection voltage corresponding to its level and apply the same to one of input terminals of the differential amplifier 8. Input to the other of the input terminals of the differential amplifier 8 is a reference voltage $V_1$ from the reference voltage selecting circuit 9 by way of example. Thus, the differential amplifier 8 performs amplification of an error voltage between the two voltages referred to above in the same manner as in the conventional example. The amplified error voltage to be delivered from the differential amplifier 8 is fed back to the variable attenuator 2 in the transmission power amplifier 4 through the loop filter 10.

Then, the variable attenuator 2 controls the quantity of attenuation based on signals from the loop filter 10. As a result, the gain of the transmission power amplifier 4 is adjusted by the variable attenuator 2 such that the error voltage between the detection voltage from the level detector 7 and the reference voltage from the reference voltage selecting circuit 9 becomes smaller. Thus, the transmission power of the linear modulation wave, which is radiated in space from the transmit antenna 6, is automatically controlled to be a predetermined value which has been set in advance, without being affected by variations in the supply voltage, changes in temperature or the like.

Figure 5:
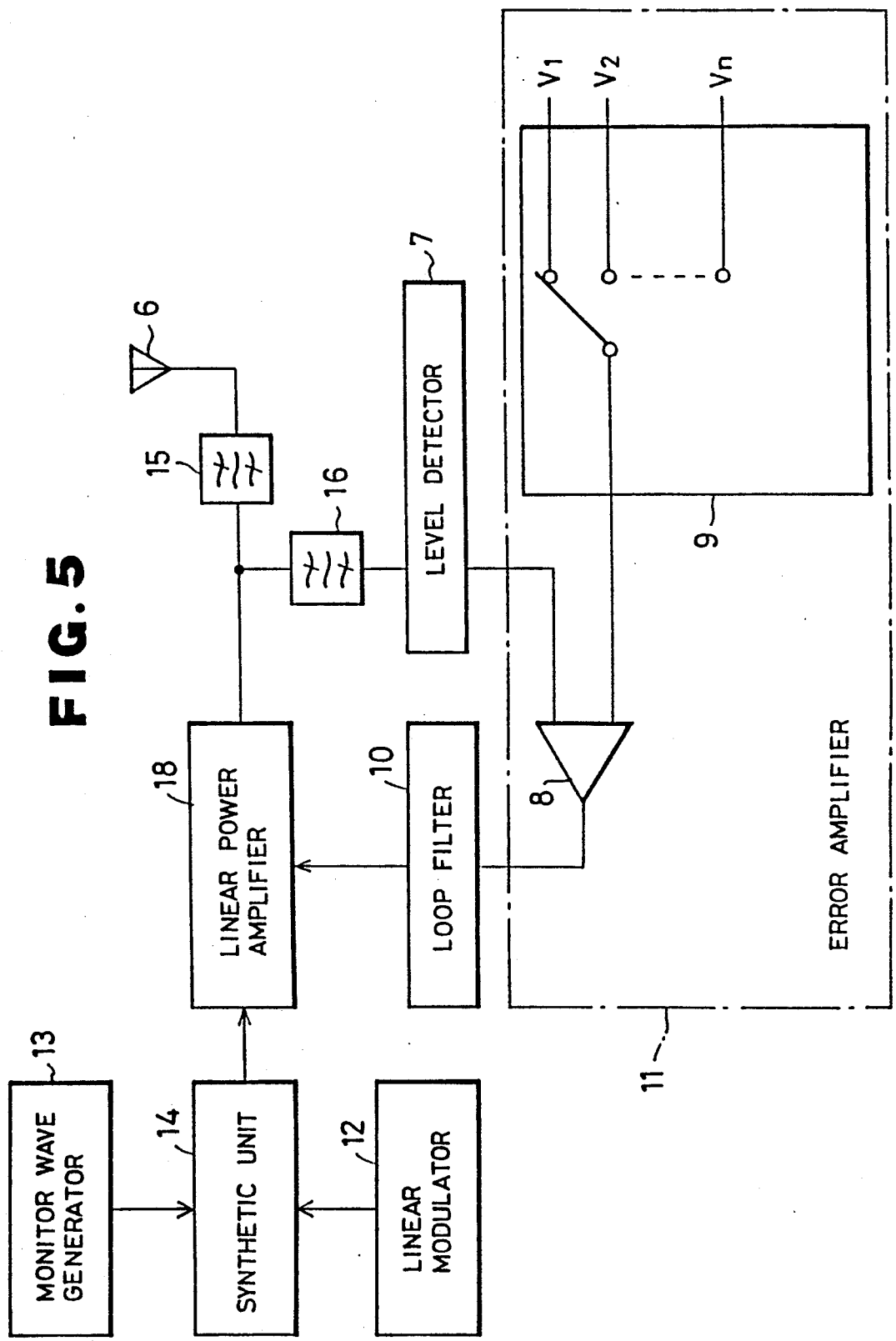
FIG. 5 is a block diagram depicting a radio transmitter according to a second embodiment of the present invention.

Incidentally, in the above-described embodiment, a description has been made in the case where the gain of the transmission power amplifier 4 is controlled by adjusting the quantity of attenuation of the variable attenuator 2 incorporated therein with outputs from the error amplifier 11. However, the gain of a linear power amplifier may be adjusted based on outputs from the error amplifier 8 by using a linear power amplifier as the transmission power amplifier, which permits adjustment of its gain while maintaining linearity. FIG. 5 is a block diagram showing a second embodiment which performs the operation referred to above. In the same drawing, numeral 18 indicates a linear power amplifier as the transmission power amplifier. All the other elements of structure are the same as in the first embodiment shown in FIG. 3 and identified by the same reference numerals, and so their descriptions will therefore be omitted.

A description has been made in the case where a plurality of outputs to be transmitted from the antenna can be treated by means of the reference voltage selecting circuit 9. If the output to be transmitted from the antenna is fixed only as one, the reference voltage selecting circuit 9 may be omitted. Furthermore, the description has been made in the case where the unmodulated monitor wave having no variation in its amplitude is employed as the monitor wave to be generated from the monitor wave generator 13. If its variation is developed more rapidly than that of the time constant of a feedback loop, a signal whose amplitude changes slightly may also be used as a monitor wave. This can bring about the same advantageous effects as those in the above-described embodiment.

Figure 6:
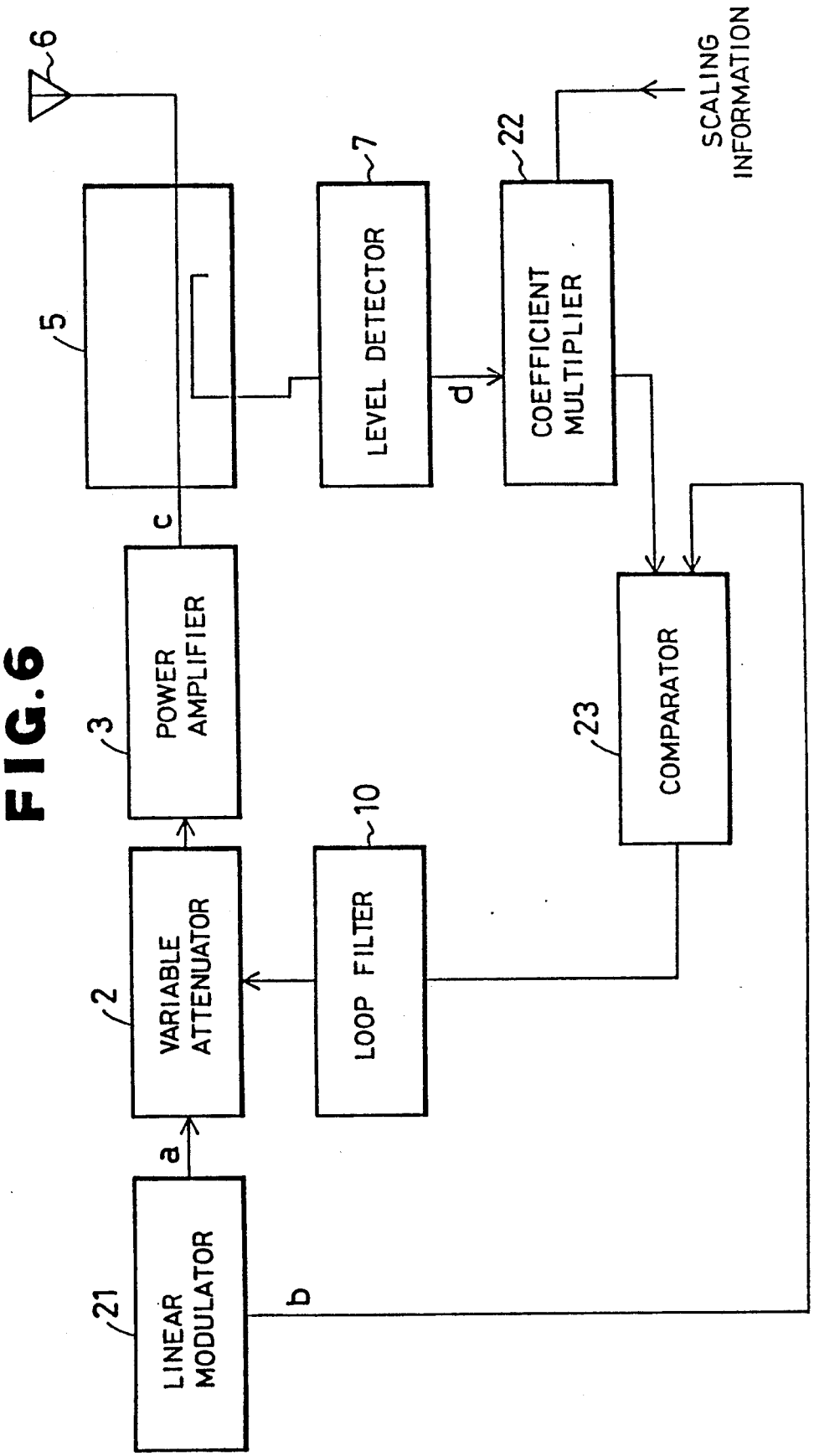
FIG. 6 is a block diagram showing a radio transmitter according to a third embodiment of the present invention.

FIG. 6 is a block diagram showing a radio transmitter according to a third embodiment of the present invention. In FIG. 6, designated at numeral 21 is a linear modulator for performing the linear modulation of a carrier wave by means of a modulation signal and for producing the envelope component of a signal prior to modulation. Where amplitude modulation is practiced for example, the baseband signal is output as the envelope component as it is. Designated at numeral 22 is a coefficient multiplier (scaling circuit) for scaling the output from a level detector 7 with a coefficient depending on mean transmission power. In addition, numeral 23 indicates a comparator for comparing a component of the output from the coefficient multiplier 22 with the envelope component of the modulation signal output from the linear modulator 21. All the other elements of structure shown in FIG. 6 are identified by the same reference numerals and are the same as those depicted in FIG. 1. FIG. 7 is a graphic representation for describing each of the wave which appear at each of the wave pickup points a to d.

A description will now be made on the operation of the radio transmitter. First of all, the linear modulator 21 serves to modulate a carrier wave with a modulating signal and apply the linearly-modulated wave to a variable attenuator 2 [see FIG. 7(a)]. At the same time, the linear modulator 21 outputs the envelope component of the modulating signal to the comparator 23 [see FIG. 8(b)]. Then, the linearly-modulated wave is subjected to linear amplification at a power amplifier 3 into an amplified signal [see FIG. 7(c)], which is in turn supplied to a transmit antenna 6 through a directional coupler 5.

On the other hand, the directional coupler 5 detects a progressive wave obtained based on the amplified signal. Then, the voltage indicative of the level of the progressive wave is converted into its corresponding voltage by the level detector 7 [see FIG. 7(d)]. The converted voltage is scaled with a coefficient depending on a predetermined mean transmission power. The predetermined mean transmission power has been determined in advance before power transmission. Information about its power is to be applied externally to the coefficient multiplier 22, as scaling information, i.e., the coefficient. An output signal from the coefficient multiplier 22 and the envelope component of a modulation signal from the linear modulator 21 are applied to the comparator 23 to be compared therein. Then, the variable attenuator 2 serves to determine the quantity to be attenuated (the quantity to be adjusted) by the variable attenuator 2, based on the result of its comparison such that the amplified signal becomes a value corresponding to the mean transmission power. Thereafter, the quantity thus determined is produced as a control signal. This control signal passes through a loop filter 10 and is thereafter applied to the variable attenuator 2 as a control input. Then, the variable attenuator 2 decides the quantity to be attenuated, based on this control signal, and adjusts the level of a modulated carrier wave so that the amplified signal becomes a signal level corresponding to the mean transmission power.

Figure 8:
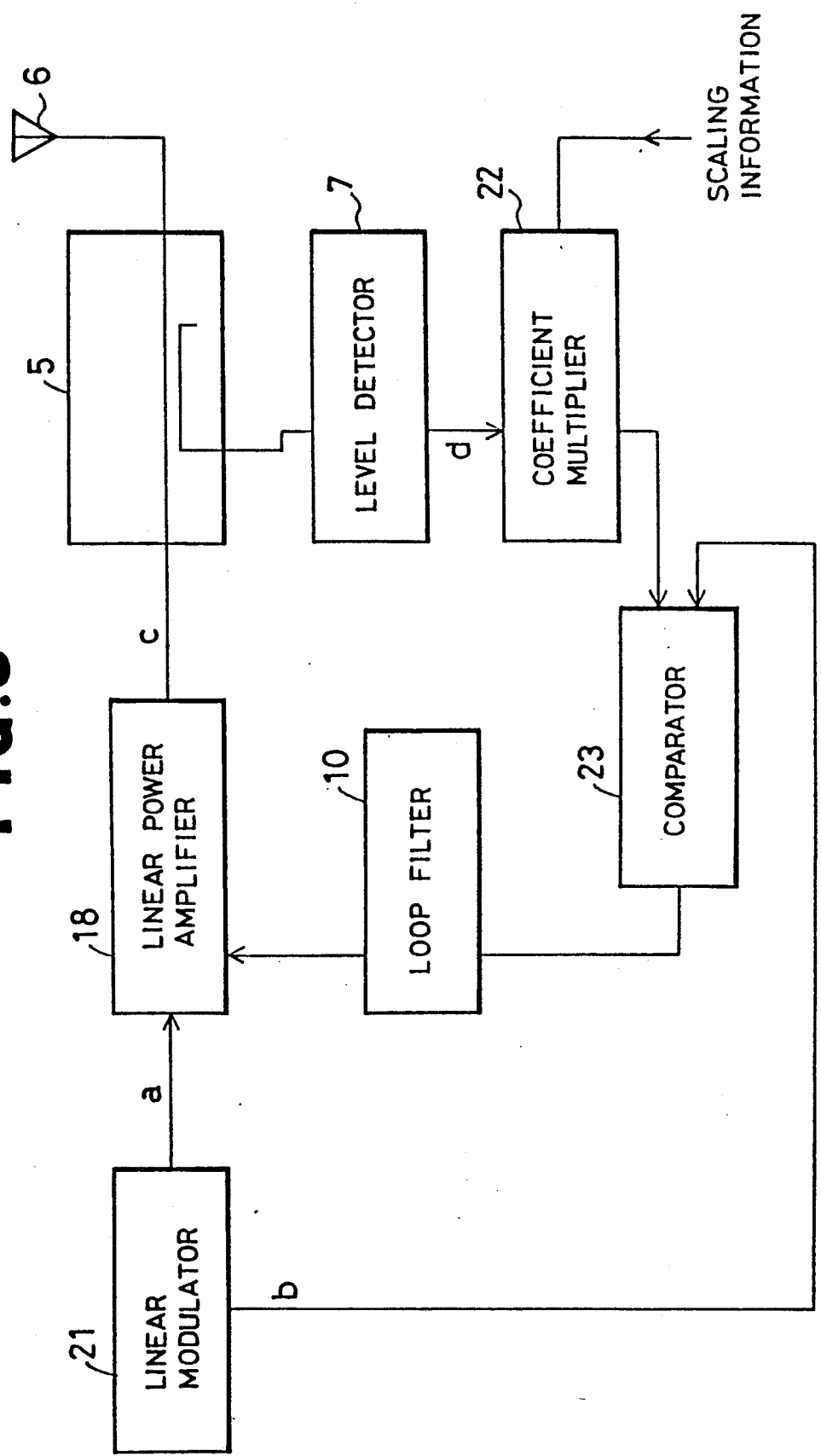
FIG. 8 is a block diagram illustrating a radio transmitter according to a fourth embodiment of the present invention.

FIG. 8 is a block diagram illustrating a radio transmitter according to a fourth embodiment of the present invention. In the same drawing, numeral 18 indicates an amplification-factor variable and linear-type power amplifier which can change the gain while maintaining linearity. If such a linear-type power amplifier 18 is employed, an output from the loop filter 10 can be applied to the linear power amplifier 18 as is.

Figure 9:
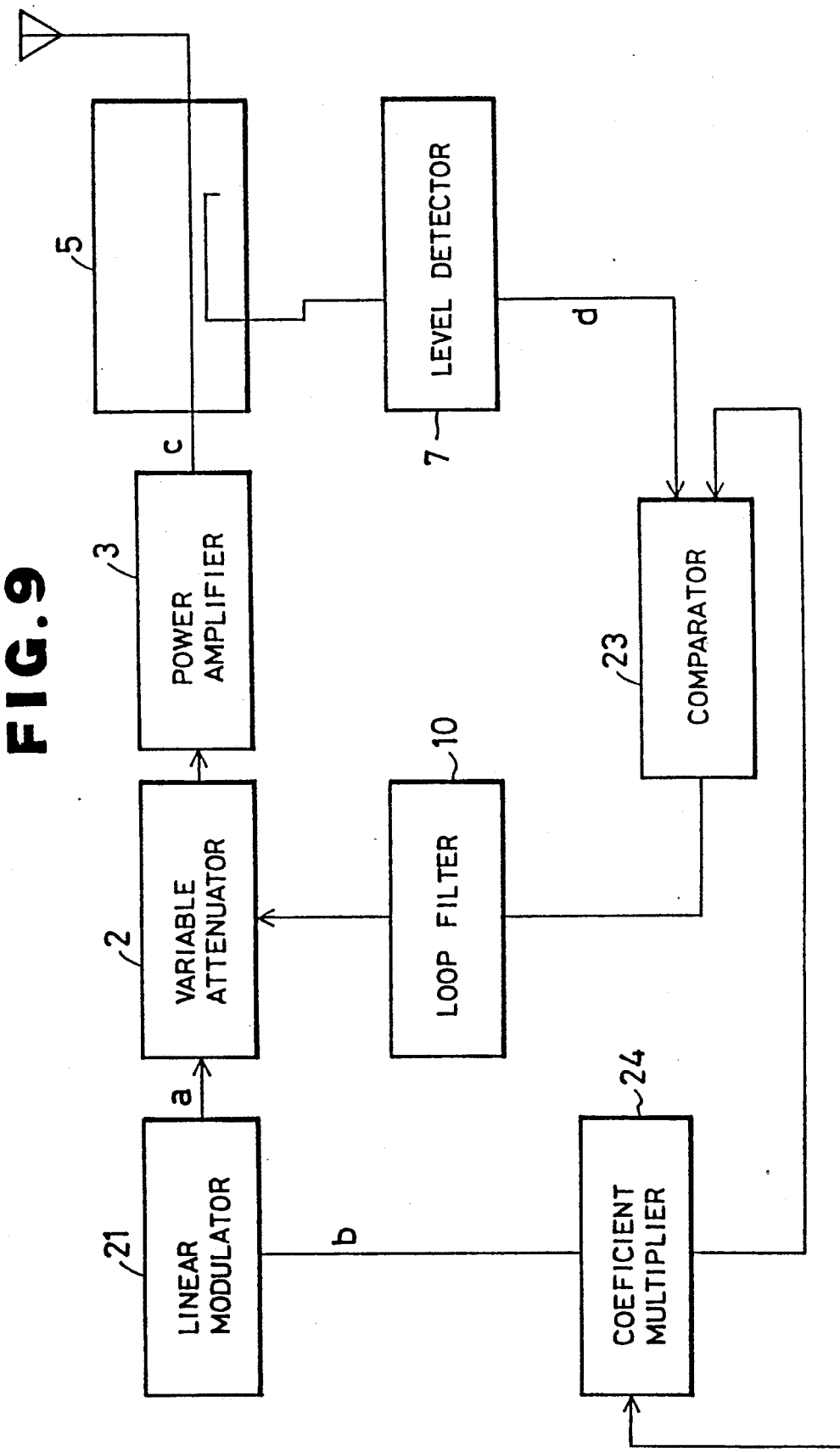
FIG. 9 is a block diagram depicting a radio transmitter according to a fifth embodiment of the present invention.

FIG. 9 is a block diagram depicting a radio transmitter according to a fifth embodiment of the present invention. In FIG. 9, designated at numeral 24 is a coefficient multiplier for scaling the envelope component of a modulating signal with a coefficient depending on a predetermined mean transmission power. In this case, an output signal from the level detector 7 is applied to the comparator 23 as it is. Although the envelope component of the modulating signal has been scaled in the present embodiment, the comparator 23 serves to produce the quantity to be adjusted in the same manner as in the fourth embodiment and the present embodiment can bring about the same effects as those in the third and fourth embodiments.

Figure 10:
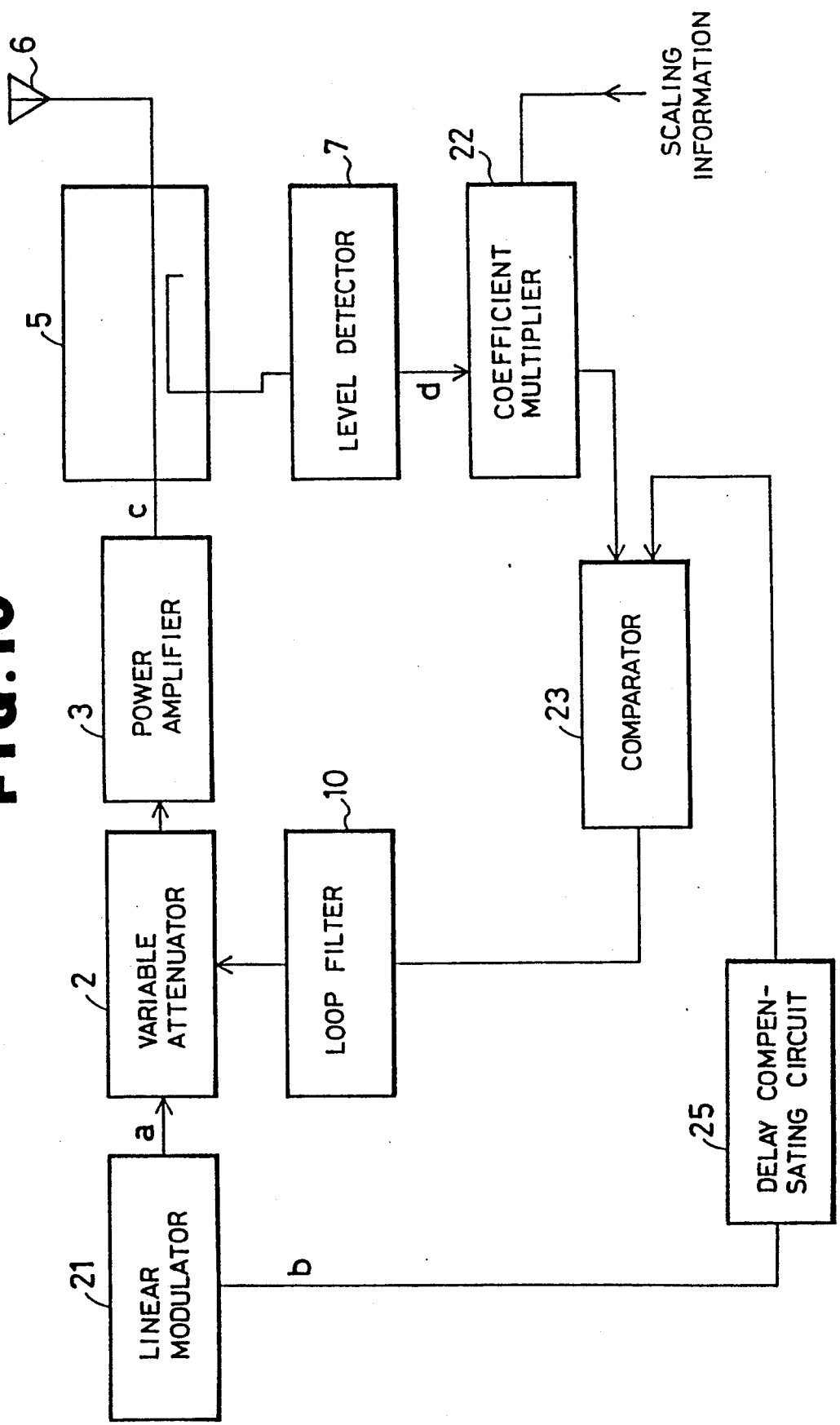
FIG. 10 is a block diagram illustrating a radio transmitter according to a sixth embodiment of the present invention.

FIG. 10 is a block diagram showing a linear-modulation type radio transmitter according to a sixth embodiment of the present invention. The delay time of each of the level detector 7 and the coefficient multiplier 22 is very short in the third and fourth embodiments. On the other hand, where such delay time cannot be neglected, the manner employed in the present embodiment is effective in particular. In other words, a delay compensating circuit 25 is provided between a linear modulator 21 and a comparator 23. In addition, the envelope component of a modulating signal applied to the comparator 23 is delayed by the delay compensating circuit 25 and the phase between an output signal from the coefficient multiplier 22 and the envelop component of the modulating signal applied to the comparator 23 is brought into alignment. Incidentally, even in this case, a linear power amplifier 18 may also be provided as an alternative to a variable attenuator 2 and a power amplifier 3.

Figure 11:
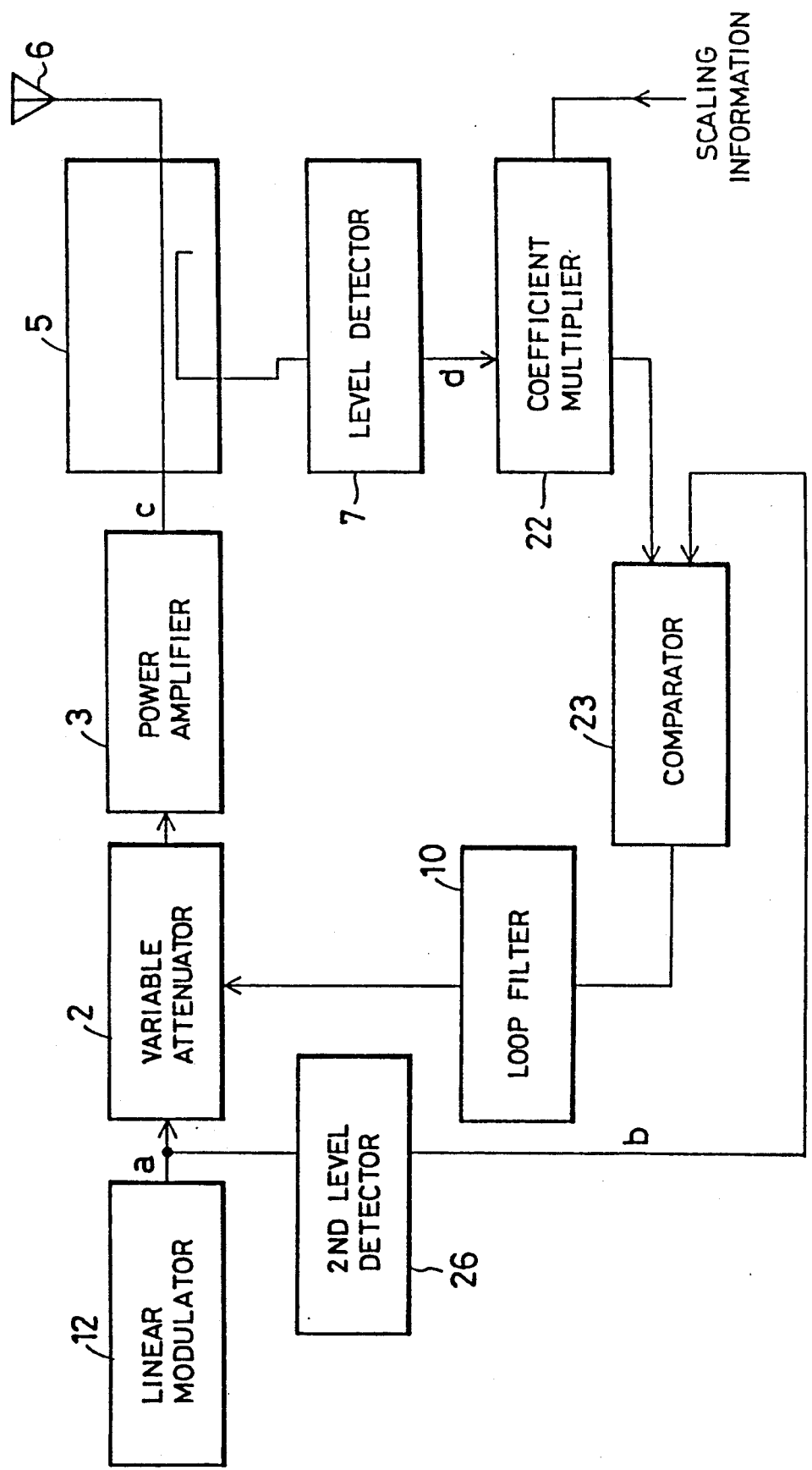
FIG. 11 is a block diagram showing a radio transmitter according to a seventh embodiment of the present invention.

Further, FIG. 11 is a block diagram showing a radio transmitter according to a seventh embodiment of the present invention. In the illustrated embodiment, a second level detector 26 detects the envelope component of a linearly-modulated wave output from a linear modulator 21 and the signal thus detected is then applied to a comparator 23. The present embodiment can, however, bring about the same effects as those in the third embodiment. Incidentally, a second level detector 26 may be provided on the input side of the coefficient multiplier 24 even in the case of the radio transmitter shown in FIG. 9.

As has been described above, the present invention provides a linear-modulation type radio transmitter of a type wherein a monitor wave having a predetermined amplitude is extracted so as to detect its level and the gain of a transmission power amplifier is then adjusted based on the detected level of the monitor wave, or a linear-modulation type radio transmitter of a type wherein information about predetermined mean transmission power is added to an envelope component of a modulating signal and an envelope component of an amplified signal output from a power amplifier, and the comparison of the two is then made, and the signal level input to the power amplifier or the gain thereof is controlled according to the result of its comparison. Therefore, the present invention can bring about advantageous effects that mean transmission power can be maintained at a predetermined value without suppressing the envelope component of a linearly-modulated carrier wave, and the application to the burst transmission can be achieved. Having now fully described the invention, it will be apparent to those skilled in the art that many changes and modifications can be made without departing from the spirit or scope of the invention as set forth herein.

What is claimed is:

1. A linear-modulation type radio transmitter, comprising:
    a linear modulator for producing a carrier wave linearly modulated based on a modulation signal;
    a transmission power amplifier capable of adjusting its transmission gain and for amplifying said linearly-modulated carrier wave;
    a transmit antenna for radiating, as an electromagnetic radio wave, an amplified signal output from said transmission power amplifier into space;
    a monitor wave generator for generating a monitor wave at a predetermined amplitude having frequencies other than those within the transmission band of said carrier wave, and means of combining said monitor wave together with said linearly-modulated carrier wave and for inputting the combined monitor wave and linearly-modulated wave to said transmission power amplifier;
    a level detector for detecting the level of components of said monitor wave out of output signal waves from said transmission power amplifier and for converting the same into a detection voltage corresponding to the level of the components of said monitor wave; and
    an error amplifier for producing a control signal for adjusting the gain of said transmission power amplifier based on the detection voltage from said level detector.

2. A linear-modulation type radio transmitter according to claim 1, wherein said transmission power amplifier includes a variable attenuator for attenuating the level of each of said linearly-modulated carrier wave and said monitor wave based on the quantity of attenuation depending on said control signal output from said error amplifier, and a power amplifier for linearly amplifying an output from said variable attenuator and for providing a constant amplification factor.

3. A linear-modulation type radio transmitter according to claim 1, wherein said transmission power amplifier includes a linear power amplifier for linearly amplifying said linearly-modulated carrier wave and said monitor wave in accordance with the amplification factor depending on said control signal output from said error amplifier.

4. A linear-modulation type radio transmitter, comprising:
    a linear modulator for producing a carrier wave linearly modulated based on a modulating signal;

a transmission power amplifier capable of adjusting its transmission gain and for amplifying said linearly-modulated carrier wave;

a transmit antenna for radiating, as an electromagnetic radio wave, an amplified signal output from said transmission power amplifier;

a level detector for detecting an envelope component of said amplified signal and producing an output signal responsive thereto;

a scaling circuit for performing level conversion of said output signal from said level detector by multiplying said output signal by a coefficient depending on a mean transmission power level which has been predetermined in advance and inputted to said scaling circuit; and a comparator for comparing a level of said output signal responsive to said envelope component of said modulating signal detected by said level detector with that of the output signal from said scaling circuit and for outputting to said transmission power amplifier a control signal for adjusting the level of said amplified signal to a value corresponding to said predetermined mean transmission power level based on the result of the comparison.

5. A linear-modulation type radio transmitter according to claim 4, wherein said transmission power amplifier includes a variable attenuator for attenuating the level of said linearly-modulated carrier wave based on the quantity of attenuation depending on said control signal output from said comparator, and a power amplifier for linearly amplifying an output from said variable attenuator and for providing a constant amplification factor.

6. A linear-modulation type radio transmitter according to claim 4, wherein said transmission power amplifier includes a linear power amplifier for linearly amplifying said linearly-modulated carrier wave in accordance with the amplification factor depending on said control signal output from said comparator.

7. A linear-modulation type radio transmitter according to claim 4, further including a delay compensating circuit for delaying the envelope component of said modulating signal and for making two signals applied to said comparator to be in phase.

8. A linear-modulation type radio transmitter according to claim 4, further including a second level detector for detecting an envelope component of said modulated carrier wave output from said linear modulator and for applying the envelope component to said comparator.

9. A linear-modulation type radio transmitter, comprising:

a linear modulator for producing a carrier wave linearly modulated based on a modulating signal;

a transmission power amplifier capable of adjusting its transmission gain and for amplifying said linearly-modulated carrier wave;

a transmit antenna for radiating, as an electromagnetic radio wave, an amplified signal output from said transmission power amplifier;

a level detector for detecting an envelope component of said amplified signal;

a scaling circuit for performing level conversion of said envelope component of said modulating signal detected by said level detector by multiplying said detected envelope component by a coefficient dependent on a mean transmission power level which has been predetermined in advance and inputted to said scaling circuit; and a comparator for comparing the level of said envelope component detected by said level detector with that of the output signal from said scaling circuit and for outputting to said transmission power amplifier a control signal for adjusting the level of said amplified signal to a value corresponding to said predetermined mean transmission power level based on the result of the comparison.

10. A linear-modulation type radio transmitter according to claim 9, wherein said transmission power amplifier includes a variable attenuator for attenuating the level of said linearly-modulated carrier wave based on the quantity of attenuation depending on said control signal output from said comparator, and a power amplifier for linearly amplifying an output from said variable attenuator and for providing a constant amplification factor.

11. A linear-modulation type radio transmitter according to claim 9, wherein said transmission power amplifier includes a linear power amplifier for linearly amplifying said linearly-modulated carrier wave in accordance with the amplification factor depending on said control signal output from said comparator.

12. A linear-modulation type radio transmitter according to claim 9, further including a second level detector for detecting an envelope component of said modulated carrier wave output from said linear modulator and for applying the envelope component to said scaling circuit.

* * * * *

UNITED STATES PATENT AND TRADEMARK OFFICE
CERTIFICATE OF CORRECTION

PATENT NO. : 5,113,525
DATED : May 12, 1992
INVENTOR(S) : Akira Andoh

It is certified that error appears in the above-indentified patent and that said Letters Patent is hereby corrected as shown below:

On the Title Page, under Item [56], and before "Primary Examiner" add the following at the end of the list --The Bell System Technical Journal:, Jan. 1979, Vol. 58, No. 1, Part 3, pp. 130-133.--.

Column 2, line 41, after "destroyed" insert a period --.--.
Column 8, line 15, after "achieved." begin a new paragraph.

Signed and Sealed this

Twelfth Day of July, 1994

Attest:

BRUCE LEHMAN

Attesting Officer

Commissioner of Patents and Trademarks